United States Patent
Camerlo

(12) 
(10) Patent No.: US 7,053,314 B1
(45) Date of Patent: May 30, 2006

(54) METHODS AND APPARATUS FOR PROVIDING A SIGNAL TO A CIRCUIT BOARD COMPONENT

(75) Inventor: Sergio Camerlo, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 167 days.

(21) Appl. No.: 10/452,543

(22) Filed: Jun. 2, 2003

(51) Int. Cl.
*H05K 1/16* (2006.01)

(52) U.S. Cl. ...................... 174/260; 174/262
(58) Field of Classification Search ................ 174/255, 174/260–262, 52.4; 361/764–768
See application file for complete search history.

(56) References Cited

U.S. PATENT DOCUMENTS

| | | | |
|---|---|---|---|
| 4,342,069 A * | 7/1982 | Link | 361/764 |
| 4,511,201 A * | 4/1985 | Baker et al. | 439/260 |
| 4,822,988 A * | 4/1989 | Gloton | 235/492 |
| 6,219,254 B1 * | 4/2001 | Akerling et al. | 361/763 |
| 6,366,467 B1 * | 4/2002 | Patel et al. | 361/760 |
| 6,452,113 B1 * | 9/2002 | Dibene et al. | 174/260 |

\* cited by examiner

*Primary Examiner*—Kamand Cuneo
*Assistant Examiner*—Yuriy Semenenko
(74) *Attorney, Agent, or Firm*—BainwoodHuang

(57) ABSTRACT

A circuit board is configured to exchange data signals with a circuit board component through data signal contacts located between the circuit board and a primary surface of the circuit board component. The circuit board has power supply signal contacts that are configured to carry power supply signals to the circuit board component through a secondary surface of the circuit board component. A signal carrier connects the power supply signal contacts of the circuit board with the circuit board component through the secondary surface of the circuit board component. Such a configuration allows the circuit board component to receive a relatively large amount of power while maintaining the number of data signal contacts dedicated for transmission of data signals between the circuit board and circuit board component.

30 Claims, 5 Drawing Sheets

METHODS AND APPARATUS FOR PROVIDING A SIGNAL TO A CIRCUIT BOARD COMPONENT

BACKGROUND

A conventional circuit board includes circuit board components, such as an Application Specific Integrated Circuit (ASIC), mounted to the circuit board. Such mounting secures the circuit board components to the circuit board and provides electrical contact between the circuit board components and the circuit board. Certain conventional circuit board components, such as ball grid array (BGA) devices) have an array of solder balls located on an attachment surface of the circuit board component (e.g., a surface of the circuit board component that attaches to the circuit board). The array of solder balls of the circuit board component attaches to contact pads, for example, located on the circuit board.

A conventional ASIC has an attachment surface having a relatively small surface area (e.g., 2025 $mm^2$). The conventional ASIC utilizes an array of solder balls having a ball diameter of 1 mm, thereby allowing placement of a relatively large number of solder balls on the attachment surface of the ASIC. In the array, the solder balls are distributed across the attachment surface of the ASIC in an array pattern of 50 columns having 50 solder balls per column. Such an array or grid configuration (50×50) results in 2500 solder balls in the array for mechanical attachment of the ASIC to the circuit board (e.g., attachment to the contact pads of the circuit board) and for electrical contact between the ASIC and the circuit board.

In a typical solder ball array, the solder balls of the ASIC allow transmission of data signals between the circuit board and the ASIC and allow transmission of power supply signals from the circuit board to the ASIC in order to power the ASIC during operation. Approximately 40–50% of the solder balls (e.g., 1000–1250 solder balls) of the conventional solder ball array are configured for carrying power supply signals from the circuit board to the ASIC. Approximately 50–60% of the remaining solder balls (e.g., 1250–1500 solder balls) of the conventional solder ball array, therefore, are configured to carry data signals between the circuit board and the ASIC.

SUMMARY

Conventional techniques for exchanging power supply signals and data signals between a circuit board component and a circuit board suffer from a variety of deficiencies.

As described above, the solder ball array of a conventional ASIC carries data signals between the circuit board and the ASIC and power supply signals from the circuit board to the ASIC in order to power the ASIC during operation. Approximately 40–50% of the solder balls (e.g., 1000–1250 solder balls) of the solder ball array are configured for carrying (e.g., transmitting and grounding) power supply signals between the circuit board and ASIC. Trends in ASIC design and application, however, indicate an increase in the power consumption (e.g., in excess of 50 W/ASIC) for ASIC's, thereby requiring an increase in the current required by such ASIC's during operation.

One method to increase the amount of power received by an ASIC involves increasing the number of solder balls of a 50×50 array dedicated to carrying power signals to the ASIC. For example, as the power consumption increases for a conventional ASIC having 2500 solder balls in a solder ball array, an increased number of the 2500 solder balls of the array (e.g., greater than 40–50% of the solder balls of the array) can be configured to carry power supply signals from the circuit board to the ASIC. As a result, however, the number of remaining solder balls of the array dedicated to carry data signals between the ASIC and the circuit board decreases. Such a configuration can reduce the overall performance (e.g., relative processing speed) of the ASIC.

Another method to increase the amount of power received by an ASIC involves increasing the number of solder balls of the ASIC solder ball array while maintaining the conventional package size (45 mm×45 mm) for the ASIC. For example, solder balls of a conventional array have a diameter of approximately 1 mm. To maintain the package size of the ASIC and increase the number of solder balls associated with the ASIC solder ball array requires a manufacturer to decrease the diameter and pitch of the solder balls of the array. For example, reducing the pitch of the solder balls to 0.8 mm allows a manufacturer to place a greater number of solder balls on a conventional ASIC attachment surface (e.g., an ASIC having a surface area of 2025 $mm^2$). Increasing the number of solder balls of the array allows a manufacturer to utilize the additional solder balls to carry power supply signals from the circuit board to the ASIC while maintaining the number of solder balls carrying data signals between the circuit board and ASIC.

Decreasing the pitch of the solder balls of the ASIC, however, decreases the strength of the solder ball array and increases the risk of fracture of the solder balls of the array. A conventional ASIC package is formed from a material (e.g., substrate) having a coefficient of thermal expansion that is different than the coefficient of thermal expansion of the circuit board material (e.g., fiberglass). Because of the differences in the coefficients of thermal expansion between the ASIC package and the circuit board, the ASIC package and the circuit board expand and contract at different rates when exposed to variations in temperature. During thermal expansion or contraction of the ASIC and the circuit board, such differences in the coefficients of thermal expansion of the ASIC package and the circuit board generate a stress on the solder balls of the array. In the case where the pitch of the solder balls of the array decreases below 1 mm, the stresses induced on the solder balls, as caused by the differences in the expansion rates of the ASIC and the circuit board, can be higher than the failure strength of the solder balls, thereby leading to potential fracturing or failure of the solder balls of the array.

Another method to increase the amount of power received by an ASIC involves increasing the number of solder balls of the ASIC while increasing the size of the ASIC packaging. Increasing the size of the ASIC packaging allows a manufacturer to add solder balls to the array and configure the additional solder balls to carry power supply signals from the circuit board to the ASIC. Such a configuration allows the manufacturer to maintain the number of solder balls of the array carrying data signals between the circuit board and ASIC.

Increasing the size of the ASIC package, however, decreases the amount of real estate available on the circuit board for other circuit board components and electrical traces. Increasing the size of the ASIC package also increases the differences in the overall expansion between the ASIC package and the circuit board. During thermal expansion or contraction of the ASIC and the circuit board the differences in the coefficients of thermal expansion of the ASIC package and the circuit board generate a stress on the solder ball array that can be higher than the failure strength of the solder balls of the array, thereby leading to potential fracturing or failure of the solder balls. To compensate for the differences in the coefficient of thermal expansion of the ASIC package and the circuit board, manufacturers can use mounting sockets in the circuit board for the solder balls to absorb the coefficient of thermal expansion mismatch. Use of the sockets, however, increases the costs associated with manufacturing the circuit board.

By contrast, embodiments of the present invention significantly overcome the described deficiencies and provide mechanisms for transmitting power supply signals and data signals between a circuit board component and a circuit board. A circuit board is configured to exchange data signals with a circuit board component through data signal contacts located between the circuit board and a primary surface of the circuit board component. The circuit board has power supply signal contacts that are configured to carry power supply signals to the circuit board component through a secondary surface of the circuit board component. A signal carrier connects the power supply signal contacts of the circuit board with the circuit board component through the secondary surface of the circuit board component. Such a configuration allows the circuit board component to receive a relatively large amount of power while maintaining the number of data signal contacts dedicated for transmission of data signals between the circuit board and circuit board component. The configuration of the circuit board, circuit board component, and the signal carrier also allows the circuit board component to receive relatively large amount of power while maintaining the package size of the circuit board component, thereby minimizing manufacturing costs associated with the circuit board.

In one arrangement, a signal carrier has a support member having a first surface and a second surface. The signal carrier has a first carrier contact coupled to the first surface of the support member that are configured to electrically communicate with a signal carrier contact of a circuit board. The circuit board has a circuit board component, where the circuit board component has a primary surface having a primary contact configured to electrically communicate with a component contact of the circuit board. The signal carrier has a second carrier contact coupled to the second surface of the support member and in electrical communication with the first carrier contact. The second carrier contact is configured to electrically communicate with a secondary contact of a secondary surface of the circuit board component. The signal carrier carries a signal, such as a power supply signal, from the circuit board to the circuit board device, thereby bypassing the interface between the circuit board and the circuit board component. In such a configuration, the signal carrier allows the circuit board component to receive a relatively larger amount of power than conventional circuit board components without modification to the size of the circuit board component.

In one arrangement, the support member of the signal carrier has a first support member portion defining a first opening having a first perimeter configured to encompass a boundary of the circuit board component where the first support member portion is configured to retain the first carrier contacts. The support member also has a second support member portion in communication with the first support member portion, the second support member portion defining a second opening having a second perimeter where the second perimeter is configured to retain the second carrier contacts. Such geometry of the support member allows the support member to surround and attach to the circuit board component during operation, thereby minimizing the amount of real estate on the circuit board used by the signal carrier.

In one arrangement, the second carrier contact of the signal carrier defines a substantially semicircular plated opening engaging the second set of contacts of the circuit board component. The semicircular plated opening allows a manufacturer to use a reflow soldering technique to electrically couple the plated opening to the contact of the circuit board component to form a relatively robust electrical connection.

In one arrangement, the first carrier contacts of the signal carrier have at least one solder ball having a diameter of at least approximately 1.0 mm. In the case where the diameter of the solder balls is at least approximately 1 mm, the solder balls absorb a stress generated between the signal carrier and the circuit board as caused by a coefficient of thermal expansion mismatch between the signal carrier and the circuit board. Use of solder balls having a diameter of at least approximately 1.0 mm, therefore, minimizes a fracture risk of the solder balls and minimizes a risk of failure of the signal carrier.

In one arrangement, the signal carrier has a power regulation device coupled to the support member and in electrical communication with the first set of terminals and the second set of terminals. Placement of the power regulation devices on the signal carrier minimizes the use of real estate or surface area of the circuit board by the power regulation devices.

The features of the invention, as described above, may be employed in electronic equipment and methods such as those of Cisco Systems of San Jose, Calif.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, with emphasis instead being placed upon illustrating the embodiments, principles and concepts of the invention.

DETAILED DESCRIPTION

Embodiments of the present invention provide mechanisms for transmitting power supply signals and data signals between a circuit board component and a circuit board. A circuit board is configured to exchange data signals with a circuit board component through data signal contacts located between the circuit board and a primary surface of the circuit board component. The circuit board has power supply signal contacts that are configured to carry power supply signals to the circuit board component through a secondary surface of the circuit board component. A signal carrier connects the power supply signal contacts of the circuit board with the circuit board component through the secondary surface of the circuit board component. Such a configuration allows the circuit board component to receive a relatively large amount of power while maintaining the number of data signal contacts dedicated for transmission of data signals between the circuit board and circuit board component. The configuration of the circuit board, circuit board component, and the signal carrier also allows the circuit board component to receive relatively large amount of power while maintaining the package size of the circuit board component, thereby minimizing manufacturing costs associated with the circuit board.

Figure 1:
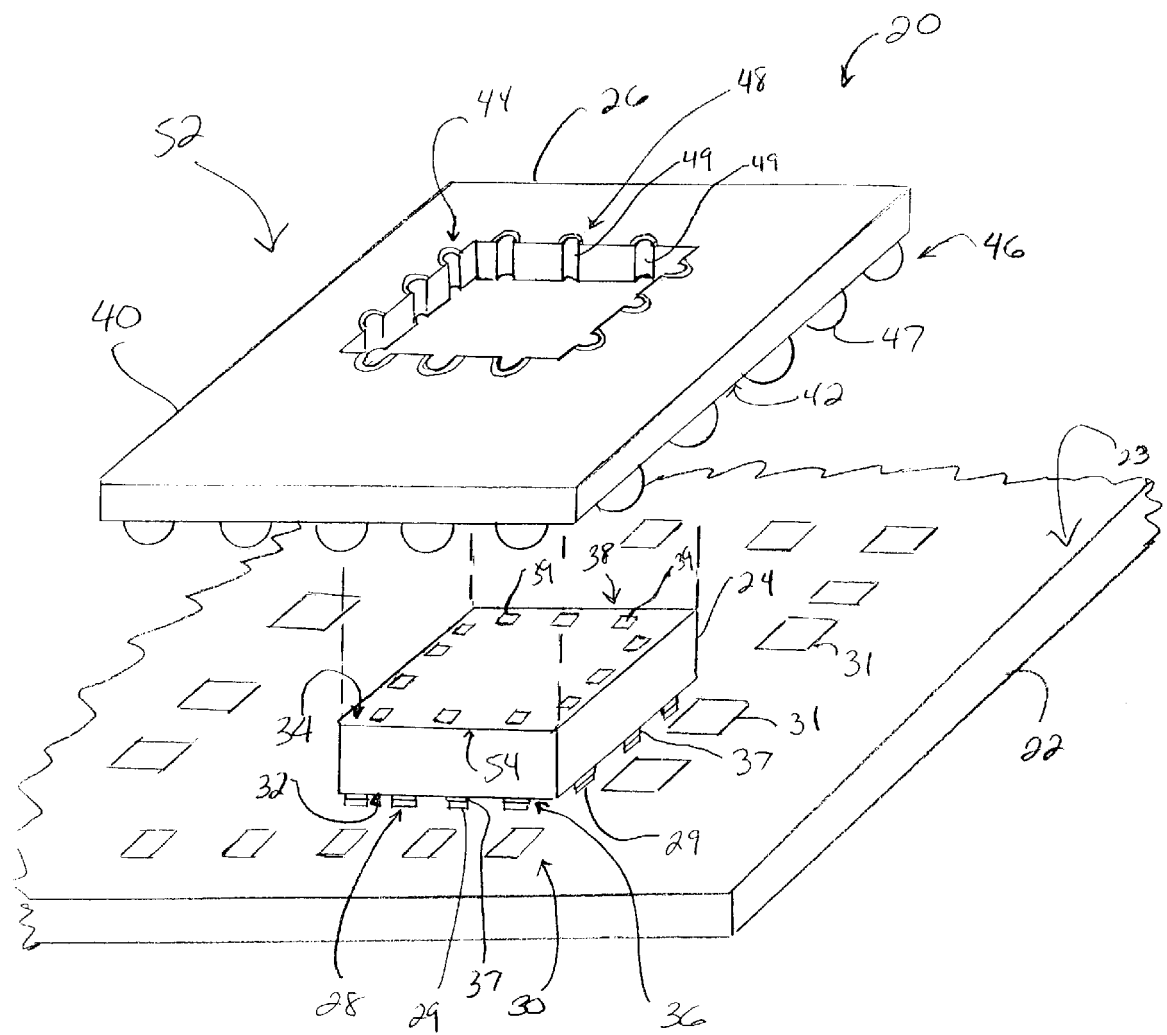
FIG. 1 is a perspective view of a circuit board assembly, according to one embodiment of the invention.

FIG. 1 illustrates an arrangement of a circuit board assembly 20 having a circuit board 22, a circuit board component 24, and a signal carrier 26.

The circuit board 22, such as formed from a fiberglass material having electrically conductive traces, has a mounting surface 23 having a set 28 of component contacts 29 and a second set 30 of signal carrier contacts 31. In one arrangement, the component contacts 29 are electrically conductive pads defined by the circuit board 22. The component contacts 29, in one arrangement, are data signal contacts 29 configured to carry data signals between the circuit board 22 and the circuit board component 24. In one arrangement, the signal carrier contacts 31 are electrically conductive pads defined by the circuit board 22. The signal carrier contacts 31, in one arrangement, are power supply signal contacts 31 configured to carry a D.C. current from the circuit board 22 to the circuit board component 24 to power the circuit board component 24 during operation.

The circuit board component 24, such as an ASIC, has a primary surface 32 and a secondary surface 34. The primary surface 32 of the circuit board component 24 faces or is directed toward the mounting surface 23 of the circuit board 22 and has a set 36 of primary contacts 37 configured electrically and mechanically couple to the component contacts 29 of the circuit board 22. For example, the primary contacts 37 are solder balls of a solder ball array. The primary contacts 37, in one arrangement, carry data signals between the circuit board 22 (e.g., via the component contacts 29 of the circuit board 22) and the circuit board component 24. Attachment of the primary contacts 37 of the circuit board component 24 to the component contacts 29 of the circuit board 22, therefore, allows data exchange or data signal transmission between the circuit board component 24 and the circuit board 22.

The secondary surface 34 of the circuit board component 24 faces away or is directed away from the mounting surface 23 of the circuit board 22 (e.g., in one arrangement, the secondary surface 34 opposes the primary surface 32). The second surface 34 of the circuit board component 24 has a set 38 of secondary contacts 39 formed from an electrically conductive material, such as a copper material. For example the secondary contacts 39 are electrically conductive pads. In one arrangement, the secondary contacts 39 are configured to receive a power supply signal from the circuit board 22 and provide grounding of the power supply signal, via the signal carrier 26. In one arrangement the secondary contacts 39 are located on the secondary surface 34 of the circuit board component 24 at a distance of approximately 1.0 mm–1.5 mm from a boundary or edge 54 of the circuit board component 24.

Figure 3:
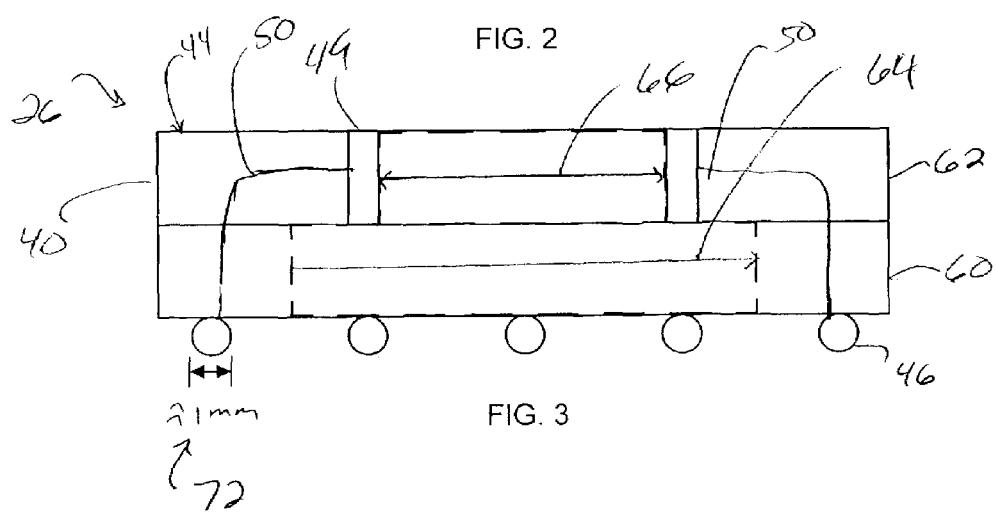
FIG. 3 illustrates a sectional view of the signal carrier of FIG. 1, according to one embodiment of the invention.

The signal carrier 26 has a support member 40, such as formed from a circuit board material (e.g. fiberglass material having electrically conductive traces), having a first surface 42 and a second surface 44. The signal carrier 26 has a set 46 first carrier contacts 47 coupled to the first surface 42 of the support member 40. The signal carrier 26 also has a set 48 of second carrier contacts 49 coupled to the second surface 44 of the support member 40. The second carrier contacts 49 electrically couple with the first carrier contacts 47 by way of electrical couplers or electrical traces 50 within the support member 40, such as illustrated in FIG. 3.

Returning to FIG. 1, the first carrier contacts 47, in one arrangement, are formed as solder balls configured to mechanically and electrically couple with the signal carrier contacts 31 (e.g., the power supply signal contacts) of the circuit board 22. The second carrier contacts 49, in one arrangement, are formed of an electrically conductive material and are configured to electrically communicate with the secondary contacts 39 of the circuit board component 24. In one arrangement, the second carrier contacts 49 are configured to transmit a D.C. current from the circuit board 22 to the circuit board component 24 to the circuit board component 24 during operation. In one arrangement, the signal carrier 26 and the circuit board component 24 form a circuit board component assembly 52.

During operation, for example, the circuit board component 24 both exchanges data signals with the circuit board 22 and receives power supply signals from the circuit board 22. In one arrangement, the circuit board component 24 exchanges data signals with the circuit board 22 through the primary contacts 37 located on the primary surface 32 (e.g., bottom surface) of the circuit board component 24. The circuit board component 24 also receives power supply signals from the circuit board 22, via the signal carrier 26, through the secondary contacts 39 located on the secondary surface 34 (e.g., top surface) of the circuit board component 24.

The configuration of the circuit board 22, the circuit board component 24, and the signal carrier 26 allows the circuit board component 24 to receive different types of signals (e.g., data signal and power supply signal) at separate locations (e.g., primary surface 32 and secondary surface 34) of the circuit board component 24, relative to the circuit board 22, where each location is configured to receive a particular signal type. For example, the circuit board component 24 receives data signals through the primary contacts 37 located on the primary surface 32 of the circuit board component 24. Furthermore, the circuit board component 24 receives power supply signals through the secondary contacts 39 located on the secondary surface 34 of the circuit board component 24. Each surface 32, 34 of the circuit board component 24 receives either data signals or power supply signals, respectively, from the circuit board component 22. In such a configuration, therefore, a manufacturer can increase the amount of power received by the circuit board component 24 without modifying the size of the circuit board component 24 or increasing the number of contacts on a single surface of the circuit board component to receive additional power supply signals.

For example, as described above, a conventional circuit board component (e.g., ASIC's) typically has a 45 mm×45 mm attachment surface area with a 2500 solder ball array. The solder ball array of the conventional circuit board component carries both data signals between the circuit board and the ASIC and power supply signals from the circuit board to the ASIC. To increase the amount of power received by a conventional circuit board component, in one arrangement, a manufacturer can increase the attachment surface area (e.g., package size) of the conventional circuit board components, thereby allowing an increase in the number of solder balls of the array. Such an increase in the array size of the solder ball array, in turn, allows an increase in the number of solder ball contacts in the array dedicated to carrying power to the circuit board component (e.g., configured to provide power to the circuit board component). Increasing the size conventional circuit board component to accommodate a greater number of solder balls of the array, however, increases the amount of circuit board surface area or real estate required to mount the modified circuit board component to the circuit board. Such an increase thereby decreases the amount of real estate available for other circuit board components and traces on the circuit board. Increasing the size conventional circuit board component, furthermore, increases the probability of a coefficient of thermal expansion mismatch between the circuit board component and the circuit board, thereby increasing the risk of failure of the solder balls.

The present circuit board component 24, by contrast, receives power supply signals through the secondary contacts 39 located on the secondary surface 34 of the circuit board component 24. To increase the amount of power received by the circuit board component 24, in one arrangement, a manufacturer increases the number of the secondary contacts 39 located on the secondary surface 34 of the circuit board component 24. Such a configuration does not require an increase in the package size of the circuit board component 24 (e.g., increase in the attachment surface area) to accommodate additional secondary contacts 39. In one arrangement, the manufacturer increases the size or gauge of the secondary contacts 39 to increase the amount of power received by the circuit board component 24. Such a configuration also does not require an increase in the package size of the circuit board component 24 to accommodate larger secondary contacts 39. By maintaining the package size of the circuit board component 24, the configuration of the circuit board assembly 20 minimizes the use of additional real estate on the circuit board 22 to support a larger circuit board component. The configuration of the circuit board assembly 20, furthermore, minimizes a potential coefficient of thermal expansion mismatch between the circuit board component 24 and the circuit board 22 by maintaining the size of the package of the circuit board component 24. Use of the circuit board assembly 20, therefore minimizes potential fracture or failure of the primary contacts 37 (e.g., solder balls) of the circuit board component 24.

As described above, the signal carrier 26 carries a signal, such as a power supply signal, from the circuit board 22 to the secondary surface 34 of the circuit board component 24. The signal carrier 26, therefore, transmits the signal to the circuit board component 24 while bypassing a connection between the component contacts 29 of the circuit board 22 and the primary contacts 37 of the circuit board component 24.

Figure 2:
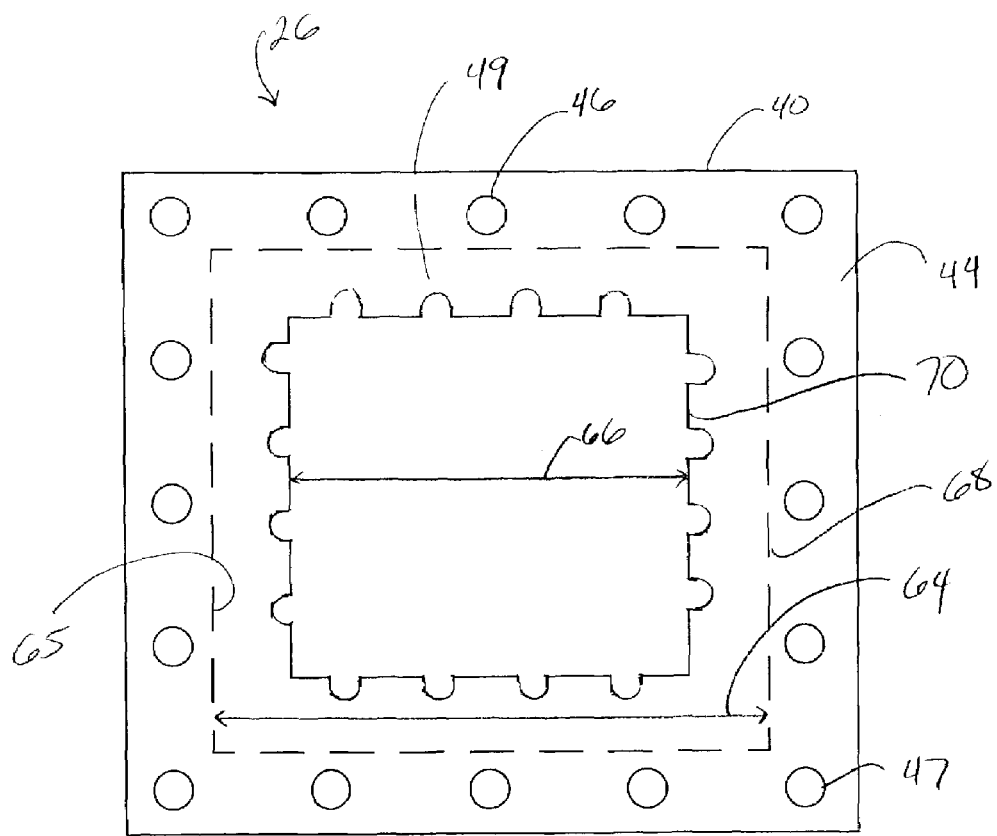
FIG. 2 illustrates a bottom view of a signal carrier of FIG. 1, according to one embodiment of the invention.

FIGS. 2 and 3 illustrate a bottom view and a side sectional view, respectively, of an arrangement of the signal carrier 26. The support member 40 of the signal carrier 26 has a first support member portion 60 defining a first opening 64 and a second support member portion 62 defining a second opening 66. In one arrangement, the first support member portion 60 and the second support member portion 62 are formed from a circuit board material (e.g., fiberglass) having traces or electrical couplers 50 that couple the first carrier contacts 47 of the first support member portion 60 with the second carrier contacts 49 of the second support member portion 62. As illustrated in FIGS. 2 and 3, the first support member portion 60 retains or carries the first carrier contacts 47 and the second support member portion 60 retains or carries the second carrier contacts 49.

The first opening 64 of the first support member portion 60 has a first perimeter 68 configured to encompass a boundary of the circuit board component 24. For example, in the case where the circuit board component 24 is an ASIC having a 45 mm×45 mm package size, each side 65 of the first opening 64 has a length greater than approximately 45 mm (e.g., the perimeter 68 of the first opening 64 is greater than the perimeter of the circuit board component 24). Such geometry of the first support member portion 60 allows the circuit board component 24 to fit within the first support member portion 60 during attachment of the signal carrier 26 to the circuit board 22. The first support member portion 60, therefore, surrounds the circuit board component 24 and minimizes the amount of real estate on the circuit board 22 used by the signal carrier 26.

The second opening 66 of the second support member portion 62 has a second perimeter 70 configured to retain the second carrier contacts 49. For example, second opening 66 positions or spaces the second carrier contacts 49 along the second perimeter 70 to correspond with the locations of the secondary contacts on the secondary surface 34 of the circuit board component 24. In such a configuration, during attachment of the signal carrier 26 to the circuit board 22, the second carrier contacts 49 of the second perimeter 70 are positioned in relative proximity to the secondary contacts 39 on the secondary surface 34 of the circuit board component 24. Such positioning allows a manufacturer to form an electrical connection between the secondary contacts 39 and the second carrier contacts 49, thereby allowing the circuit board component 24 to receive a power supply signal from the circuit board 22.

FIG. 3 shows an arrangement of the first carrier contacts 47 of the signal carrier 26. As illustrated the first carrier contacts 47 are configured as solder balls having a diameter 72 of at least approximately 1 mm. Such a configuration of the first carrier contacts 47 allows the first carrier contacts 47 to absorb stresses generated by a coefficient of thermal expansion mismatch between the signal carrier 26 and the circuit board 22. For example, assume the signal carrier 26 is formed of a material having a coefficient of thermal expansion different than the coefficient of thermal expansion of the material forming the circuit board 22 (e.g., a coefficient of thermal expansion mismatch). Because of the differences in the coefficients of thermal expansion, the signal carrier 26 and the circuit board 22 expand and contract at different rates when exposed to variations in temperature. During thermal expansion or contraction of the signal carrier 26 and the circuit board 22, such differences in expansion rates of the signal carrier 26 and the circuit board 22 generate a stress on the first carrier contacts 47. In the case where the diameter 72 of the first carrier contacts (e.g., solder balls) 47 is at least approximately 1 mm, the first carrier contacts 47 absorb the generated stresses, thereby minimizing a risk of fracture or failure of the contacts 47.

Figure 4:
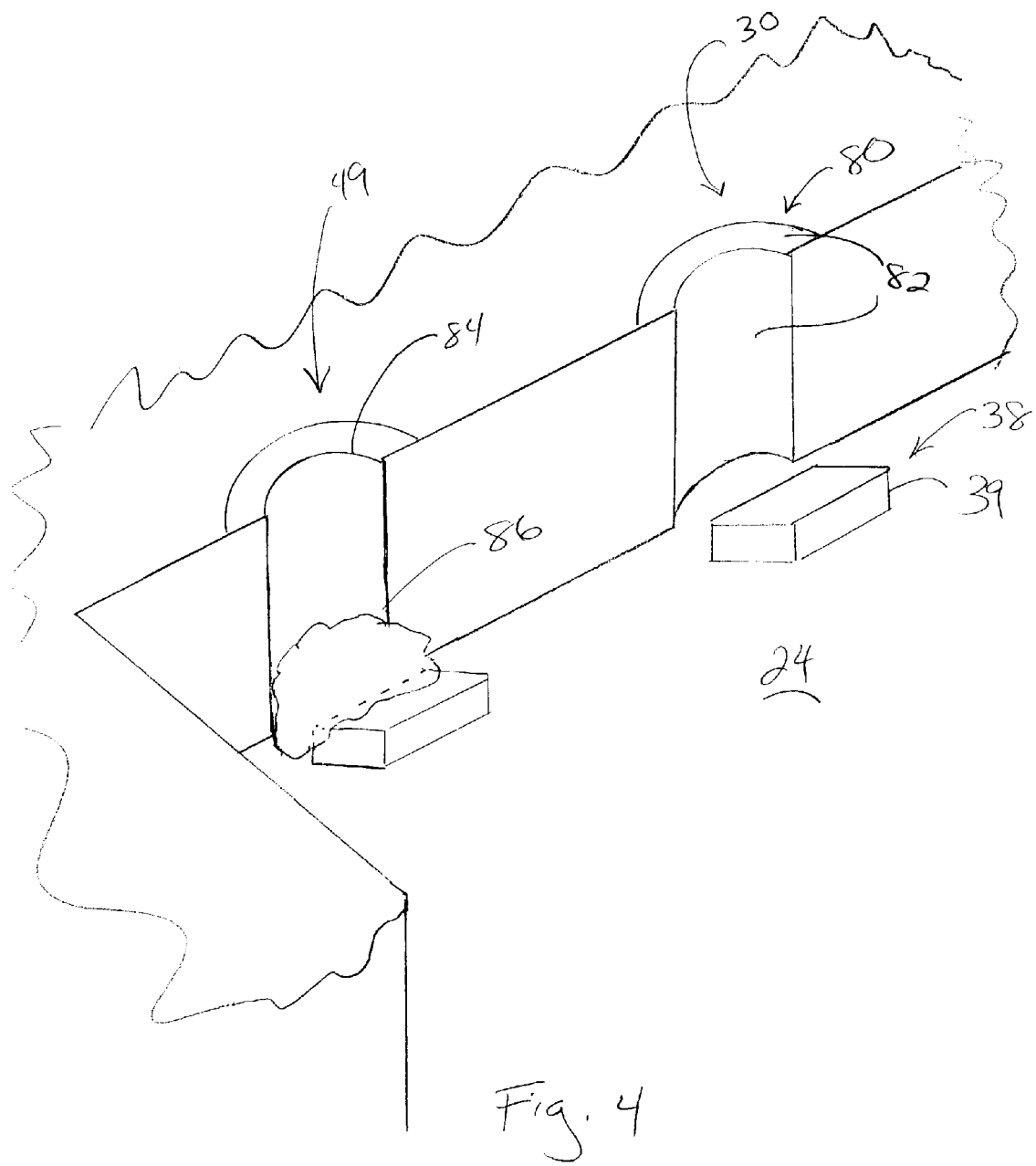
FIG. 4 illustrates a perspective view of the interface between the signal carrier of FIG. 1 and the circuit board component, according to one embodiment of the invention.

FIG. 4 illustrates, in one arrangement, the signal carrier 26 defining the second carrier contacts 49 as substantially semicircular plated openings 80. Each semicircular plated opening 80 has a plated coating 82, such as an electrically conductive or metallic coating, that electrically contacts an electrical coupler 50 of the support member 40 to form an electrical contact with a first carrier contact 47 of the signal carrier 26.

Use of the semicircular plated openings 80, in one arrangement, allows a manufacturer to use a reflow soldering technique to electrically couple the signal carrier 26 to the contacts 39 of the circuit board component 24. The reflow soldering technique provides a relatively robust connection between the semicircular plated openings 80 and the secondary contacts 39 of the circuit board component 24.

In one arrangement, the semicircular plated openings 80 of the signal carrier 26 the semicircular plated openings 80 each have a perimeter 84 that absorbs stresses generated on a solder connection 86 between the secondary contacts 39 of the circuit board component 24 and the signal carrier 26. For example, in one arrangement, the solder connection 86 experiences a stress caused as a result of a coefficient of thermal expansion mismatch between the material forming the signal carrier 26 and the material forming the circuit board component 24. The perimeter 84 expands or contracts as a result of the stresses placed on the solder connection 86, thereby reducing the stress on the solder connection 86 and minimizing a risk of fracture of the solder connection 86.

Figure 5:
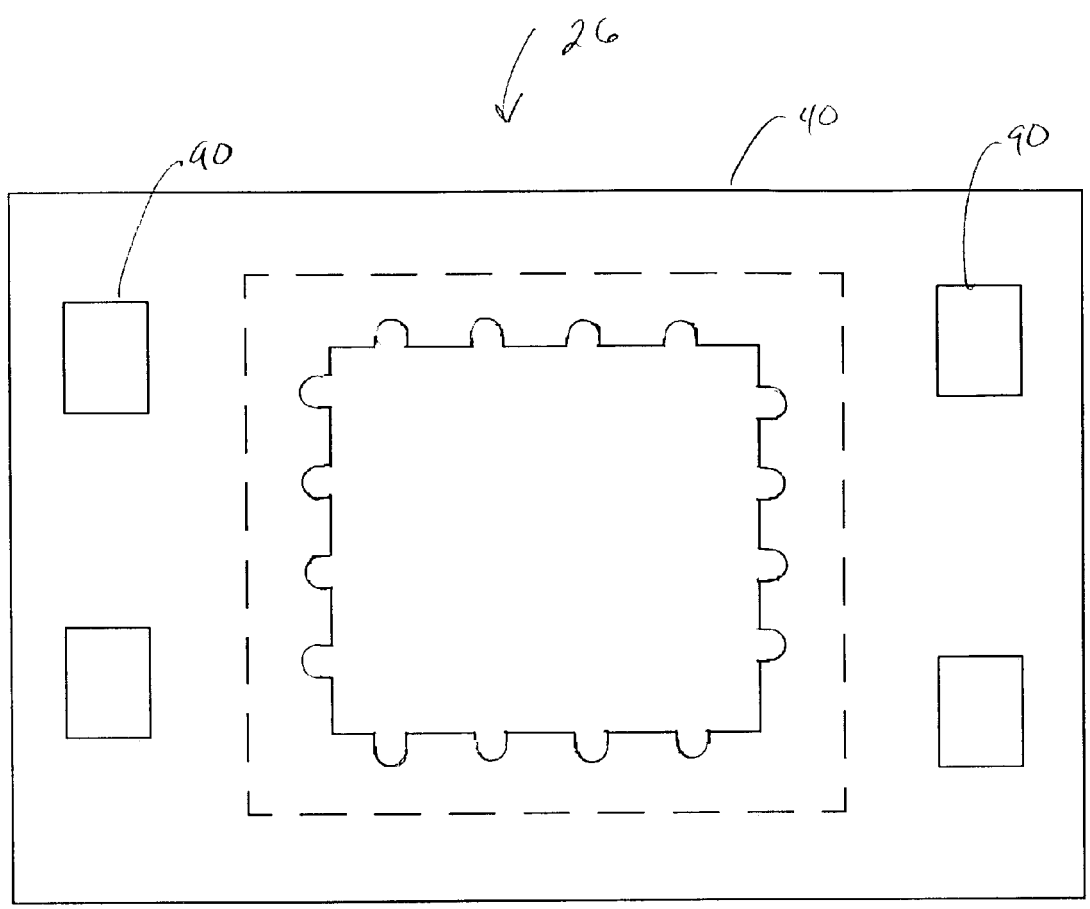
FIG. 5 illustrates a top view of the signal carrier of FIG. 1, according to one embodiment of the invention.

FIG. 5 illustrates, in one arrangement, the signal carrier 26 having power regulation devices 90 coupled to the support member 40. For example, the power regulation devices 90 include charge to digital converters (CDC's), voltage regulators, capacitors, or DC—DC converters. In certain cases the circuit board component 24 requires a power signal having a particular voltage. The power regulation devices 90 electrically connect between the first carrier contact 47 and the second carrier contact 49 of the signal carrier 26 and provide a power supply signal having an appropriate voltage (e.g., a required voltage) to the circuit board component 24. Placement of the power regulation devices 90 on the signal carrier 26 minimizes the amount of real estate or surface area of the circuit board 22 as required by the power regulation devices 90.

Figure 6:
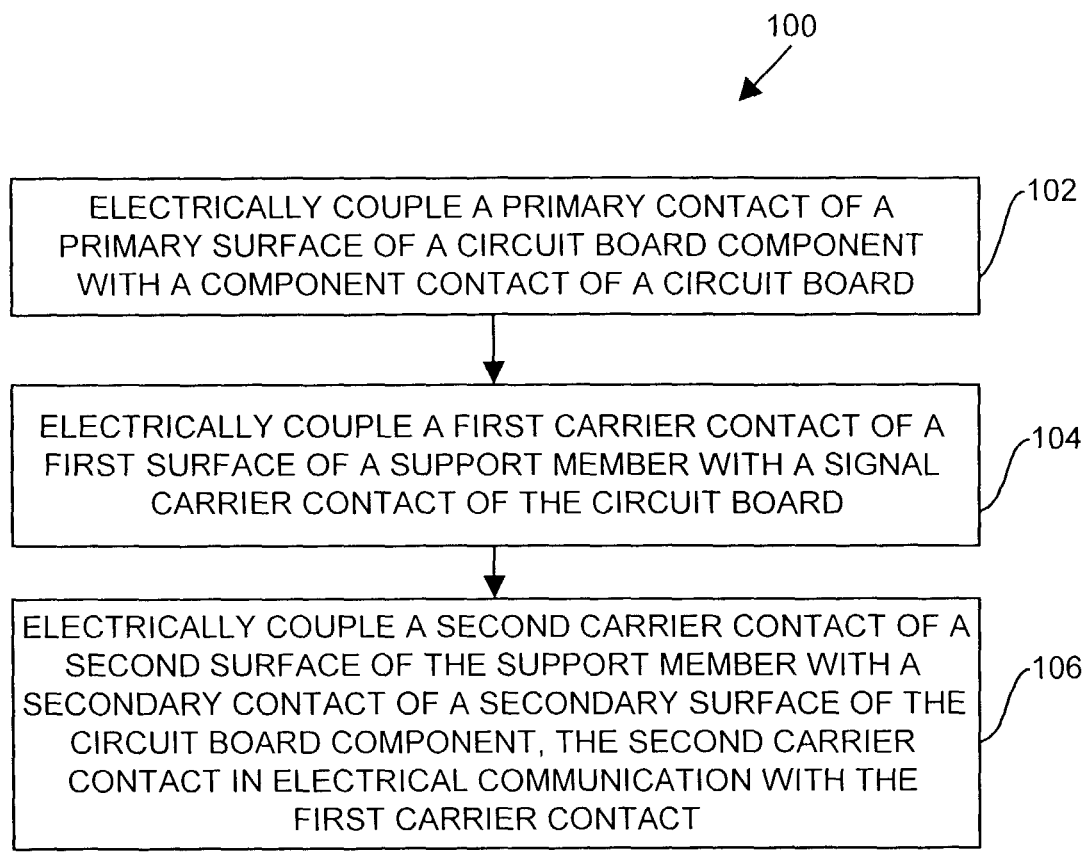
FIG. 6 is a flow chart showing a method for assembling a circuit board assembly, according to one embodiment of the invention.
Figure 1:
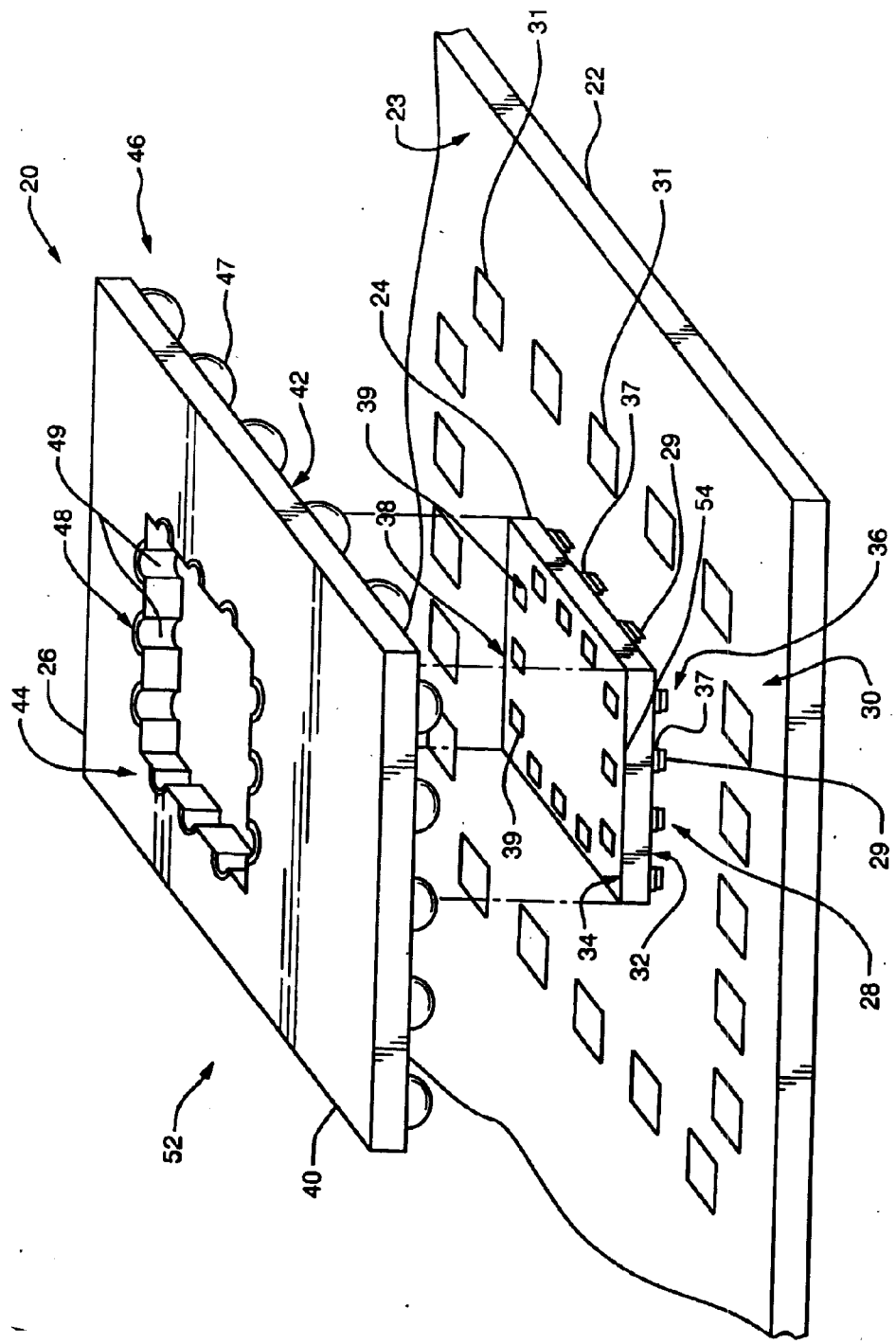
Figure 2:
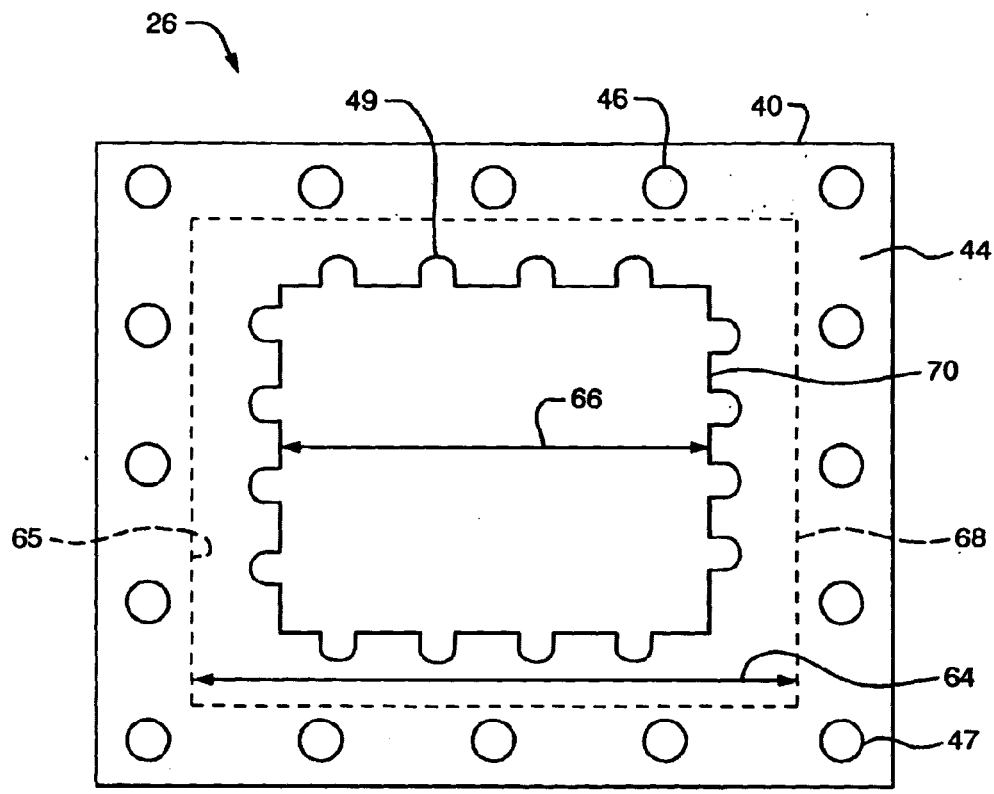
Figure 3:
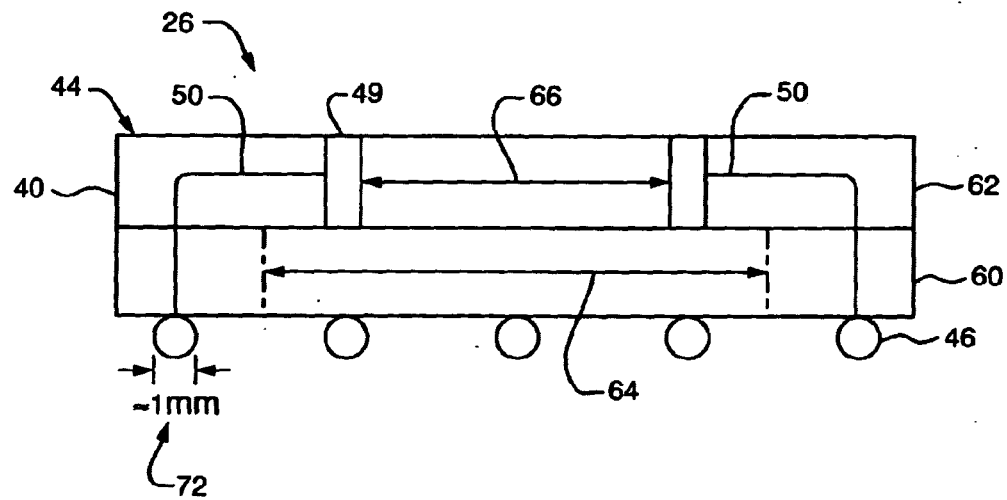
Figure 4:
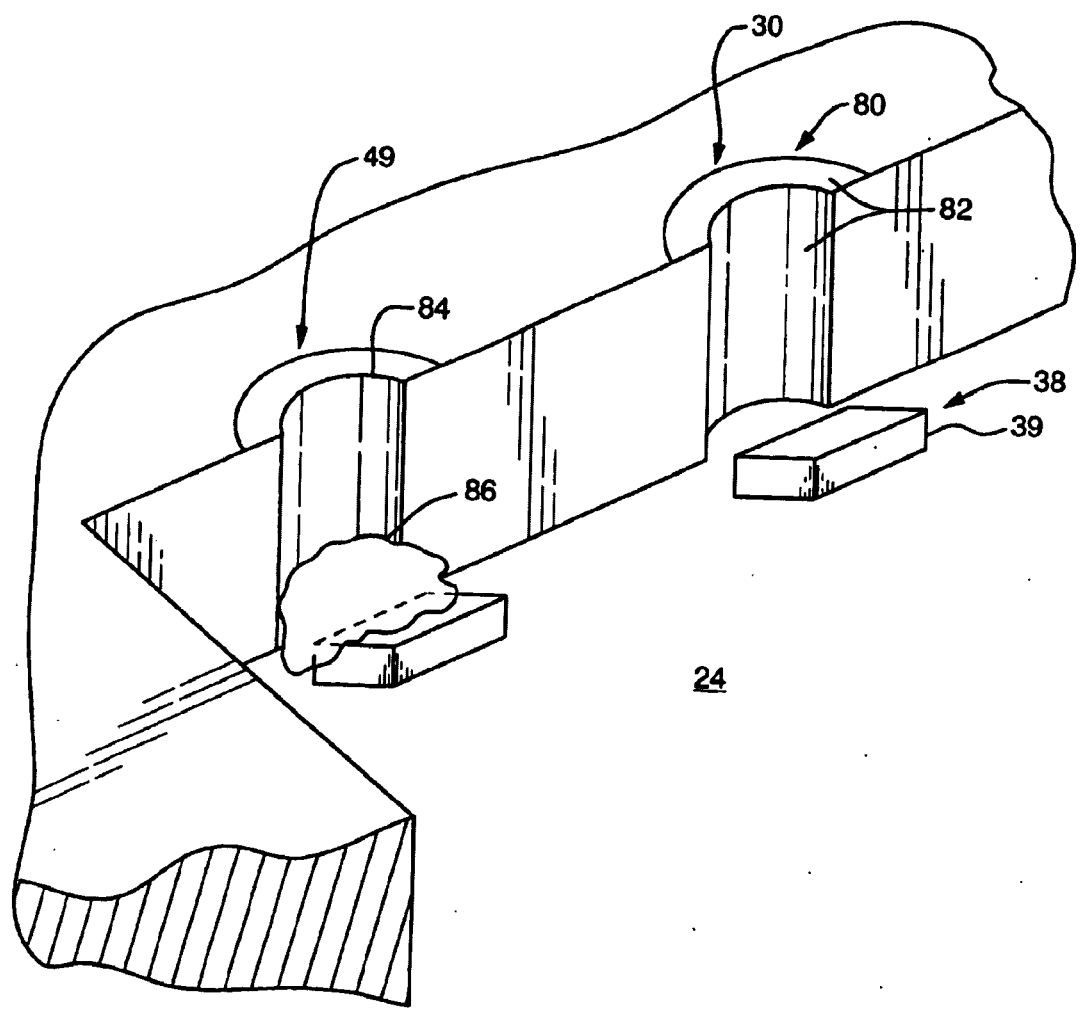
Figure 5:
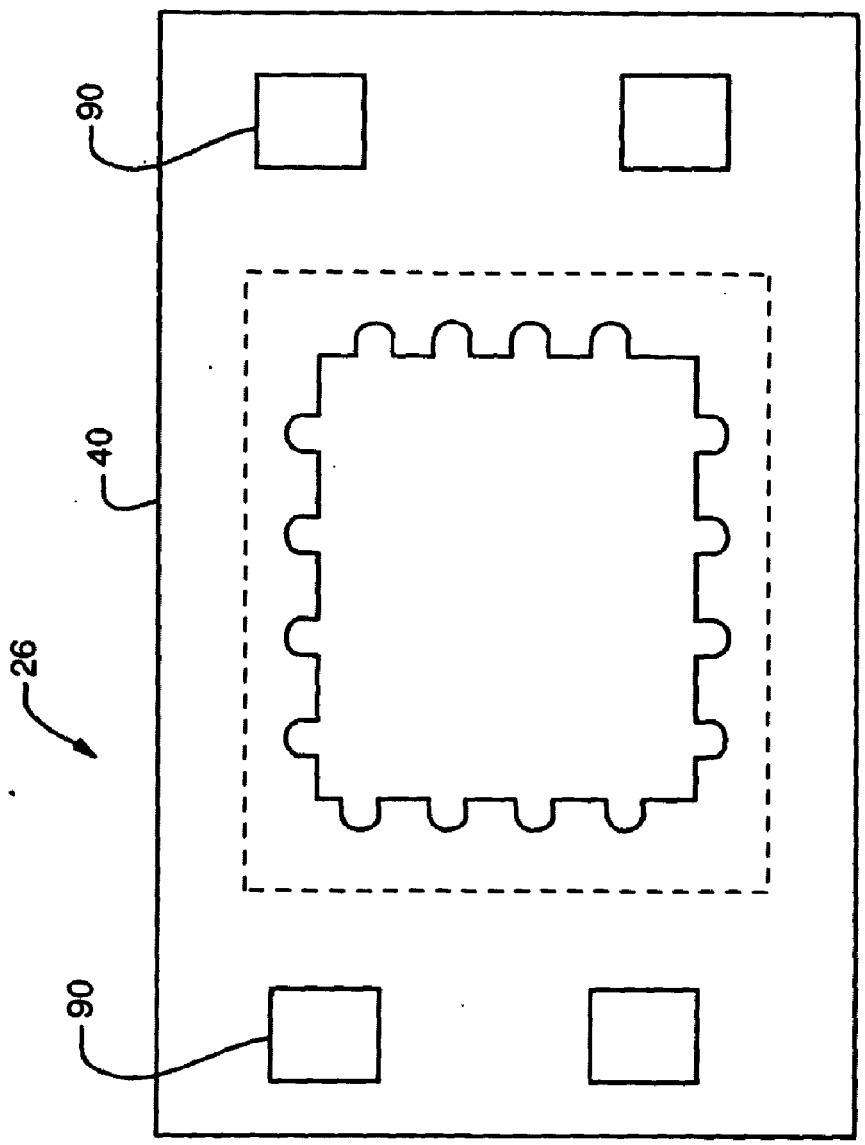
Figure 6:
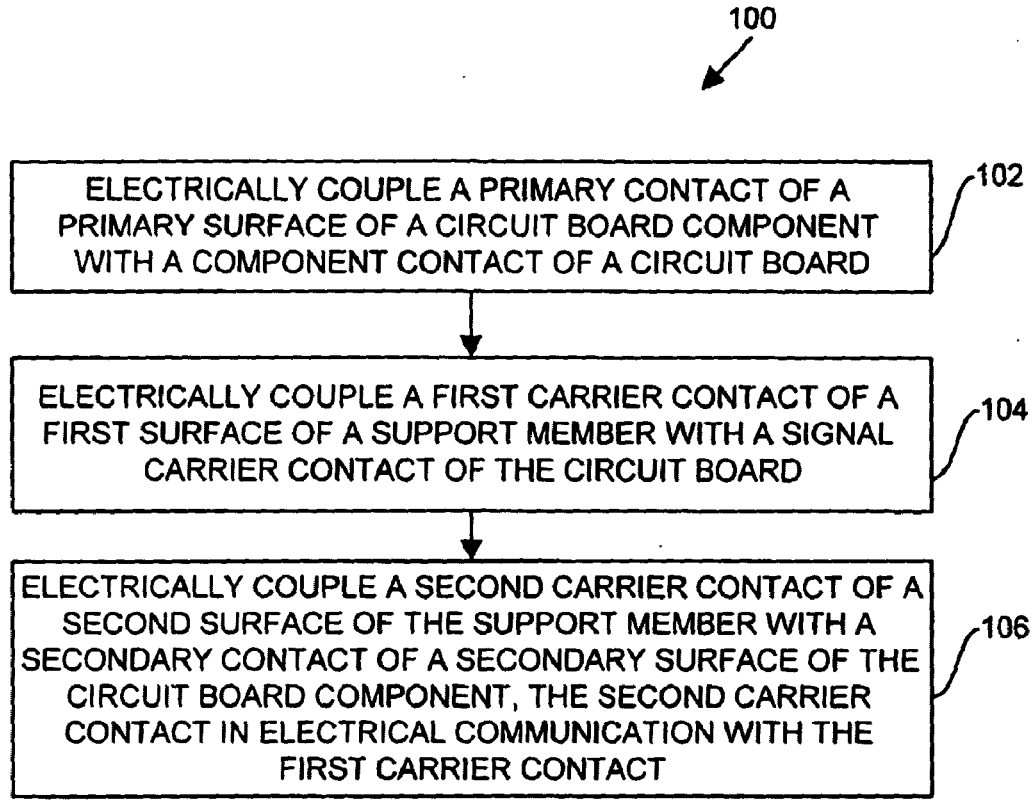

FIG. 6 illustrates a method 100 for assembling a circuit board assembly 20, according to one embodiment of the invention. Such a method can be performed either manually (e.g., by a technician on an assembly line) or automatically (e.g., by automated equipment).

In step 102, an assembler electrically couples a primary contact 37 of a primary surface 32 of a circuit board component 24 with a component contact 29 of a circuit board 22. For example, in one arrangement, the assembler attaches a solder ball array 37 of the primary surface 32 of the circuit board component 24 with contact pads 29 of the circuit board 22. Attachment of the primary contacts 37 with the component contacts 29 provides data signal transmission between the circuit board 22 and the circuit board component 24, for example.

In step 104, the assembler electrically couples a first carrier contact 47 of a first surface 42 of a support member 40, with a signal carrier contact 31 of the circuit board 22. For example, in one arrangement, the assembler attaches solder balls 47 of the support member 40 to contact pads 31 of the circuit board 22.

In step 106, an assembler electrically couples a second carrier contact 49 of a second surface 44 of the support member 40 with a secondary contact 39 of a secondary surface 34 of the circuit board component 24 where the second carrier contact 49 is in electrical communication with the first carrier contact 47. For example, in one arrangement, attachment of the first carrier contacts 47 of the support member 40 with the signal carrier contacts 31 of the circuit board 22 provides power supply signal transmission between the signal carrier contacts 31 of the circuit board 22 and the second carrier contacts 49 of the support member 40. Further attachment of the second carrier contact 49 of the support member 40 with the secondary contacts 39 of the circuit board component 24 provides power supply signal transmission between the signal carrier contacts 31 of the circuit board 22 and the secondary contacts 39 of the circuit board component 24. Such a configuration allows an assembler to increase the amount of power provided to the circuit board component 24 without requiring alteration or modification to the size of the circuit board component 24.

Those skilled in the art will understand that there can be many variations made to the embodiments explained above while still achieving the same objective of those embodiments and the invention in general.

FIGS. 1 and 4 show the secondary contacts 39 of the circuit board component 24 as electrically conductive pads extending from the second surface 34 of the circuit board component 24. Such a configuration is by way of example only. In one arrangement, the secondary contacts 39 of the circuit board component 24 are formed as cylindrical protrusions located on the second surface 34 of the circuit board component 24.

With respect to FIG. 1, as described, the circuit board component 24 is configured with a primary surface 32 having primary contacts 37 that carry a data signal between the circuit board 22 and the circuit board component 24. Also as described, the circuit board component 24 is configured with a secondary surface 34 having secondary contacts 39 that carry a power supply signal, transmitted by the signal carrier 24, from the circuit board 22. Such a configuration is by way of example only. In one arrangement, the circuit board component 24 is configured with the primary surface 32 having primary contacts 37 that carry a power supply signal from the circuit board 22 to the circuit board component 24. Furthermore, in such an arrangement, the circuit board component 24 is configured with the secondary surface 34 having secondary contacts 39 that carry a data signal between the circuit board 22 and the circuit board component 24, via the signal carrier 26. In such an arrangement, therefore, the signal carrier 26 carries the data signal between the circuit board 22 and the circuit board component 24.

Such variations are intended to be covered by the scope of this invention. As such, the foregoing description of embodiments of the invention is not intended to be limiting. Rather, any limitations to the invention are presented in the following claims.

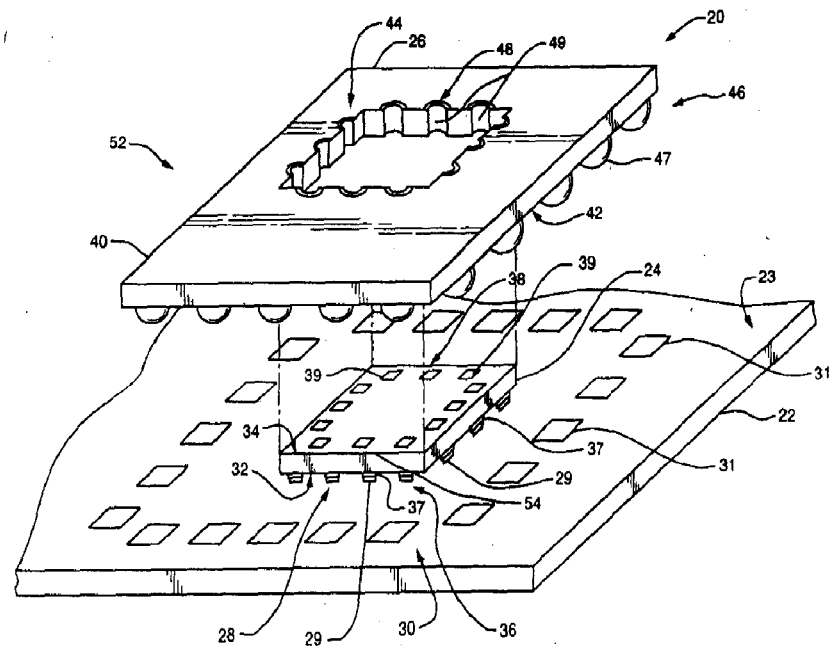

The invention claimed is:

1. A signal carrier comprising:
    a support member having a first surface and a second surface;
    a first carrier contact coupled to the first surface of the support member and configured to electrically communicate with a signal carrier contact of a circuit board, the circuit board having a circuit board component, the circuit board component having a primary surface having a primary contact configured to electrically communicate with a component contact of the circuit board; and
    a second carrier contact coupled to the second surface of the support member and in electrical communication with the first carrier contact, the second carrier contact configured to electrically communicate with a secondary contact of a secondary surface of the circuit board component;
    wherein the primary surface of the circuit board component faces the circuit board;

wherein the primary contact of the primary surface of the circuit board component directly attaches to the component contact of the circuit board through a solder joint;

wherein the secondary surface of the circuit board component faces away from the circuit board; and wherein the second carrier contact of the signal carrier directly attaches to the secondary contact of the secondary surface of the circuit board component.

2. The signal carrier of claim 1 wherein the support member comprises:

a first support member portion defining a first opening having a first perimeter configured to encompass a boundary of the circuit board component, the first support member portion configured to retain the first carrier contact; and a second support member portion in communication with the first support member portion, the second support member portion defining a second opening having a second perimeter, the second perimeter configured to retain the second carrier contact.

3. The signal carrier of claim 1 wherein the second carrier contact of the signal carrier defines a substantially semicircular plated opening configured to engage the secondary contact of the circuit board component.

4. The signal carrier of claim 1 wherein the first carrier contact of the signal carrier comprises at least one solder ball having a diameter of at least approximately 1.0 mm.

5. The signal carrier of claim 1 wherein the signal carrier further comprises a power regulation device coupled to the support member and in electrical communication with the first carrier contact and the second carrier contact.

6. The signal carrier of claim 1 wherein the second carrier contact of the signal carrier is configured to attach directly to the circuit board through another joint while the circuit board component is physically disposed between the support member of the signal carrier and the circuit board.

7. The signal carrier of claim 6 wherein the first surface of the support member and the second surface of the support member face directions which are different from each other.

8. A circuit board component assembly comprising:

a circuit board component having a primary surface and a secondary surface, the primary surface having a primary contact configured to electrically communicate with a component contact of a circuit board and the secondary surface having a secondary contact; and a signal carrier having:

a support member having a first surface and a second surface;

a first carrier contact coupled to the first surface of the support member and configured to electrically communicate with a signal carrier contact of the circuit board; and a second carrier contact coupled to the second surface of the support member and in electrical communication with the first carrier contact, the second carrier contact configured to electrically communicate with the secondary contact of a secondary surface of the circuit board component;

wherein the circuit board component faces the circuit board;

wherein the primary contact of the primary surface of the circuit board component directly attaches to the component contact of the circuit board through a solder joint;

wherein the secondary surface of the circuit board component faces away from the circuit board; and wherein the second carrier contact of the signal carrier directly attaches to the secondary contact of the secondary surface of the circuit board component.

9. The circuit board component assembly of claim 8 wherein the support member comprises:

a first support member portion defining a first opening having a first perimeter configured to encompass a boundary of the circuit board component, the first support member portion configured to retain the first carrier contact; and a second support member portion in communication with the first support member portion, the second support member portion defining a second opening having a second perimeter, the second perimeter configured to retain the second carrier contact.

10. The circuit board component assembly of claim 8 wherein the second carrier contact of the signal carrier defines a substantially semicircular plated opening configured to engage the secondary contact of the circuit board component.

11. The circuit board component assembly of claim 8 wherein the first carrier contact of the signal carrier comprises at least one solder ball having a diameter of at least approximately 1.0 mm.

12. The circuit board component assembly of claim 8 wherein the signal carrier further comprises a power regulation device coupled to the support member and in electrical communication with the first carrier contact and the second carrier contact.

13. The circuit board component assembly of claim 8 wherein the second carrier contact of the signal carrier is configured to attach directly to the circuit board through another joint while the circuit board component is physically disposed between the support member of the signal carrier and the circuit board.

14. The circuit board component assembly of claim 1 wherein the first surface of the support member and the second surface of the support member face directions which are different from each other.

15. A circuit board assembly comprising:

a circuit board having a component contact and a signal carrier contact;

a circuit board component having a primary surface and a secondary surface, the primary surface having a primary contact in electrical communicate with the component contact of the circuit board and the secondary surface having a secondary contact; and a signal carrier having:

a support member having a first surface and a second surface;

a first carrier contact coupled to the first surface of the support member in electrical communication with the signal carrier contact of the circuit board; and a second carrier contact coupled to the second surface of the support member and in electrical communication with the first carrier contact, the second carrier contact in electrical communication with the secondary contact of the secondary surface of the circuit board component;

wherein the primary surface of the circuit board component faces the circuit board;

wherein the primary contact of the primary surface of the circuit board component directly attaches to the component contact of the circuit board through a solder joint;

wherein the secondary surface of the circuit board component faces away from the circuit board; and wherein the second carrier contact of the signal carrier directly attaches to the secondary contact of the secondary surface of the circuit board component.

16. The circuit board assembly of claim 15 wherein the support member comprises:
a first support member portion defining a first opening having a first perimeter configured to encompass a boundary of the circuit board component, the first support member portion configured to retain the first carrier contact; and
a second support member portion in communication with the first support member portion, the second support member portion defining a second opening having a second perimeter, the second perimeter configured to retain the second carrier contact.

17. The circuit board assembly of claim 15 wherein the second carrier contact of the signal carrier defines a substantially semicircular plated opening configured to engage the secondary contact of the circuit board component.

18. The circuit board assembly of claim 15 wherein the first carrier contact of the signal carrier comprises at least one solder ball having a diameter of at least approximately 1.0 mm.

19. The circuit board assembly of claim 15 wherein the signal carrier further comprises a power regulation device coupled to the support member and in electrical communication with the first carrier contact and the second carrier contact.

20. The circuit board assembly of claim 15 wherein the signal carrier contact of the circuit board is configured to carry a power supply signal and the component contact of the circuit board is configured to carry a data signal.

21. The circuit board assembly of claim 15 wherein the second carrier contact of the signal carrier is configured to attach directly to the circuit board through another joint while the circuit board component is physically disposed between the support member of the signal carrier and the circuit board.

22. The circuit board assembly of claim 21 wherein the first surface of the support member and the second surface of the support member face directions which are different from each other.

23. A signal carrier comprising:
a support means having a first surface and a second surface;
a first carrier contact means, coupled to the first surface of the support means, for electrically communicating with a signal carrier contact means of a circuit board, the circuit board having a circuit board component, the circuit board component having a primary surface having a primary contact means for electrically communicating with a component contact means of the circuit board; and
a second carrier contact means, coupled to the second surface of the support means and in electrical communication with the first carrier contact means, for electrically communicating with a secondary contact means of a secondary surface of the circuit board component;
wherein the primary surface of the circuit board component faces the circuit board;
wherein the primary contact means of the primary surface of the circuit board component directly attaches to the component contact means of the circuit board through a solder joint;
wherein the secondary surface of the circuit board component faces away from the circuit board; and
wherein the second carrier contact means of the signal carrier directly attaches to the secondary contact means of the secondary surface of the circuit board component.

24. The signal carrier of claim 23 wherein the second carrier contact means of the signal carrier is configured to attach directly to the circuit board through another joint while the circuit board component is physically disposed between the support member of the signal carrier and the circuit board.

25. The signal carrier of claim 24 wherein the first surface of the support member and the second surface of the support member face directions which are different from each other.

26. A method for forming a circuit board assembly comprising:
electrically coupling a primary contact of a primary surface of a circuit board component with a component contact of a circuit board;
electrically coupling a first carrier contact of a first surface of a support member with a signal carrier contact of the circuit board;
electrically coupling a second carrier contact of a second surface of the support member with a secondary contact of a secondary surface of the circuit board component, the second carrier contact in electrical communication with the first carrier contact;
wherein the primary surface of the circuit board component faces the circuit board;
wherein the primary contact of the primary surface of the circuit board component directly attaches to the component contact of the circuit board through a solder joint;
wherein the secondary surface of the circuit board component faces away from the circuit board; and
wherein the second carrier contact of the signal carrier directly attaches to the secondary contact of the secondary surface of the circuit board component.

27. The method of claim 26 further comprising encompassing a boundary of the circuit board component with a first perimeter of a first opening of a first support member portion of the support member, the first support member portion configured to retain the first carrier contact.

28. The method of claim 26 wherein the step of electrically coupling the second carrier contact comprises coupling a substantially semicircular plated opening with the secondary contact of the secondary surface of the circuit board component.

29. The method of claim 26 wherein the step of electrically coupling a first carrier contact comprises coupling at least one solder ball having a diameter of at least approximately 1.0 mm to the signal carrier contact of the circuit board.

30. The method of claim 26 further comprising coupling a power regulation device to the support member, the power regulation device in electrical communication with the first carrier contact and the second carrier contact.

* * * * *

UNITED STATES PATENT AND TRADEMARK OFFICE
CERTIFICATE OF CORRECTION

PATENT NO.        : 7,053,314 B1
APPLICATION NO.   : 10/452543
DATED             : May 30, 2006
INVENTOR(S)       : Camerlo It is certified that error appears in the above-identified patent and that said Letters Patent is hereby corrected as shown below:

Delete Title page illustrating figure, and substitute therefor, new Title page illustrating figure. (attached)

Delete drawing sheets 1-5, and substitute therefor, drawings sheets 1-5, with the attached sheets.

Claim 14, Column 12, Line 36, "The circuit board component assembly of claim 1" should read -- The circuit board component assembly of claim 13 --.

Signed and Sealed this

Twenty-sixth Day of September, 2006

JON W. DUDAS
*Director of the United States Patent and Trademark Office*

(12) United States Patent
Camerlo

(10) Patent No.: US 7,053,314 B1
(45) Date of Patent: May 30, 2006

(54) METHODS AND APPARATUS FOR PROVIDING A SIGNAL TO A CIRCUIT BOARD COMPONENT

(75) Inventor: Sergio Camerlo, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 167 days.

(21) Appl. No.: 10/452,543

(22) Filed: Jun. 2, 2003

(51) Int. Cl.
*H05K 1/16* (2006.01)

(52) U.S. Cl. .................................. 174/260; 174/262
(58) Field of Classification Search ............ 174/255, 174/260–262, 52.4; 361/764–768
See application file for complete search history.

(56) References Cited

U.S. PATENT DOCUMENTS

| | | | |
|---|---|---|---|
| 4,342,069 A * | 7/1982 | Link | 361/764 |
| 4,511,201 A * | 4/1985 | Baker et al. | 439/260 |
| 4,822,988 A * | 4/1989 | Gloton | 235/492 |
| 6,219,254 B1 * | 4/2001 | Akerling et al. | 361/763 |
| 6,366,467 B1 * | 4/2002 | Patel et al. | 361/760 |
| 6,452,113 B1 * | 9/2002 | Dibene et al. | 174/260 |

* cited by examiner

*Primary Examiner*—Kamand Cuneo
*Assistant Examiner*—Yuriy Semenenko
(74) *Attorney, Agent, or Firm*—BainwoodHuang

(57) ABSTRACT

A circuit board is configured to exchange data signals with a circuit board component through data signal contacts located between the circuit board and a primary surface of the circuit board component. The circuit board has power supply signal contacts that are configured to carry power supply signals to the circuit board component through a secondary surface of the circuit board component. A signal carrier connects the power supply signal contacts of the circuit board with the circuit board component through the secondary surface of the circuit board component. Such a configuration allows the circuit board component to receive a relatively large amount of power while maintaining the number of data signal contacts dedicated for transmission of data signals between the circuit board and circuit board component.

30 Claims, 5 Drawing Sheets